United States Patent [19]

Blake et al.

[11] Patent Number: 4,771,366

[45] Date of Patent: Sep. 13, 1988

[54] CERAMIC CARD ASSEMBLY HAVING ENHANCED POWER DISTRIBUTION AND COOLING

[75] Inventors: Bruce E. Blake, LaGrangeville; Eric B. Hultmark, Wappingers Falls; Frank P. Presti, Hopewell Junction; Raymond Ricci, Wappingers Falls; Roger A. Rippens, Salt Point, all of N.Y.

[73] Assignee: International Business Machines Corporation, Armonk, N.Y.

[21] Appl. No.: 70,281

[22] Filed: Jul. 6, 1987

[51] Int. Cl.⁴ .............................................. H05K 7/20
[52] U.S. Cl. ..................................... 361/387; 357/81; 361/385; 361/398; 361/407; 361/414; 439/67; 439/329
[58] Field of Search ................. 165/80.2, 80.3, 104.33; 439/67, 77, 329; 174/52 FP, 68.5; 357/81, 82; 361/385, 386, 387, 388, 398, 401, 403, 407, 410, 412, 413, 414, 415

[56] References Cited

U.S. PATENT DOCUMENTS

| | | | |
|---|---|---|---|
| 3,007,131 | 10/1961 | Dahlgrer | 439/492 |
| 3,312,878 | 4/1967 | Poch et al. | 317/101 |
| 3,579,206 | 5/1971 | Grange | 439/77 |
| 3,806,767 | 4/1974 | Lehrfeld | 361/398 |
| 3,993,123 | 11/1976 | Chu et al. | 165/80 |
| 4,120,021 | 10/1978 | Roush | 361/388 |
| 4,186,422 | 1/1980 | Laemer | 361/388 |
| 4,439,815 | 3/1984 | Close | 439/77 |
| 4,619,316 | 10/1986 | Nakayama | 361/385 |
| 4,628,411 | 12/1986 | Balderes | 361/407 |
| 4,646,202 | 2/1987 | Hook | 361/385 |
| 4,688,151 | 8/1987 | Kraus | 361/407 |
| 4,704,658 | 11/1987 | Yokouchi | 361/385 |

OTHER PUBLICATIONS

Dorler et al., "A Ceramic Card Concept", Apr. 1982, pp. 456–459, published by the IEEE.
Fedoush et al., "Low-Profile Ceramic-Card Cooling Package", IBM TDB, Oct. 1985, vol. 28, No. 5, pp. 2114–2115.
Aichelmann et al., "Three-Dimensional MLC Substrate Integrated Circuit Support Package", IBM TDB, Apr. 1978, vol. 20, No. 11A, pp. 4349–4350.
Arnold et al., "Cap with Metallization Designed for Reflow Solder Attachment to a Substrate Seal Band", IBM TDB, Nov. 1979, vol. 22, No. 6, p. 2278.
Haddad et al., "Dual Seal Band Metallurgy on MLC Substrates", IBM TDB, Feb. 1980, vol. 22, No. 9, pp. 4059–4061.

Primary Examiner—G. P. Tolin
Attorney, Agent, or Firm—Steven J. Meyers

[57] ABSTRACT

A ceramic card assembly which provides high density three dimensional semiconductor device packaging and overcomes the power distribution and thermal management problems that have impaired prior ceramic cards. The ceramic card assembly combines ceramic cards with flexible power distribution structures which provide low inductance and low resistance power distribution, making ceramic cards available for high performance VLSI systems. Each ceramic card assembly comprises a ceramic card having a plurality of chip sites and power contacts thereon, and at least one flexible power distribution structure having alternating insulation (i.e. polyimide) layers and conductor (i.e., copper) layers, the flexible power distribution structures are mounted adjacent to the ceramic cards so that conductive layers of the ceramic cards are selectively exposed to the power contacts. The ceramic card assemblies are preferably combined into a field replaceable unit that includes cold plates between ceramic cards. High density packages further include ceramic in-line packages which quadruple current day memory density.

13 Claims, 7 Drawing Sheets

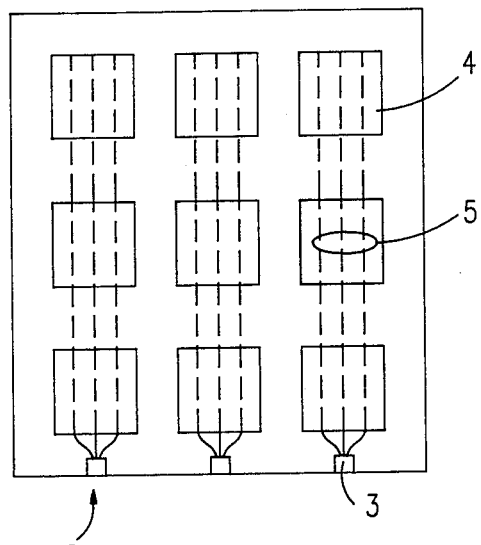
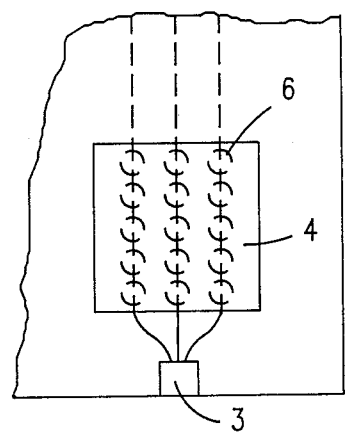
FIG.1A (PRIOR ART)
FIG.1C (PRIOR ART)
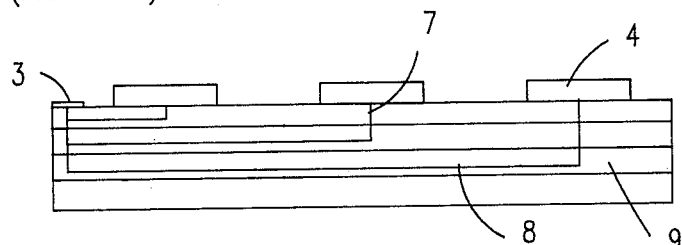
FIG.1B (PRIOR ART)
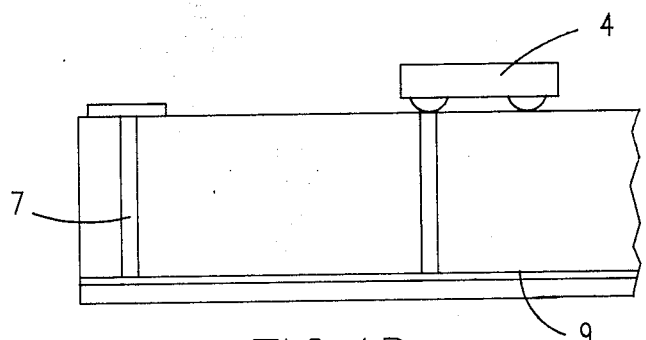
FIG.1D (PRIOR ART)

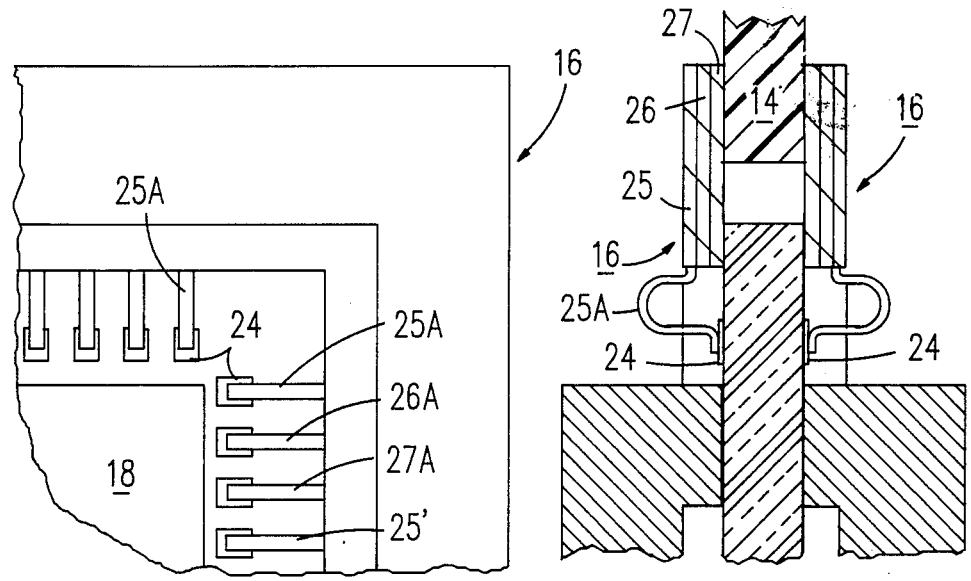
FIG.5D
FIG.5C
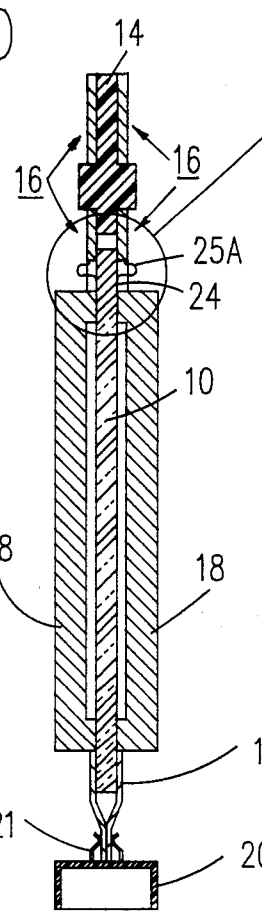
FIG.5B

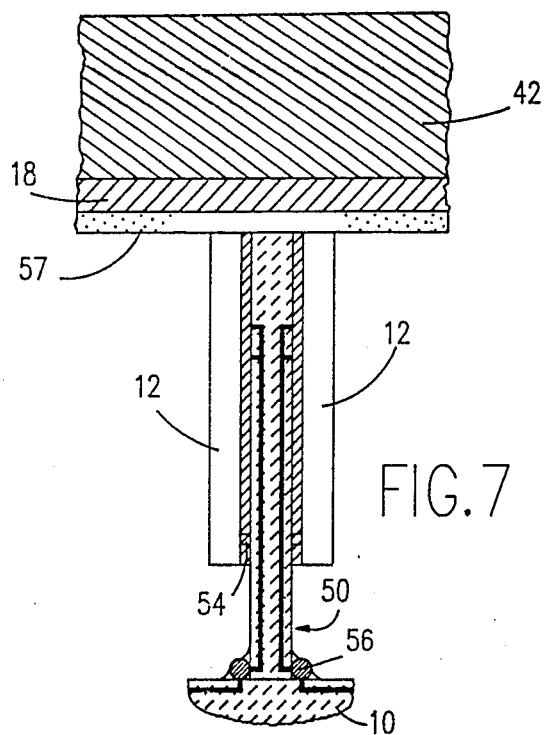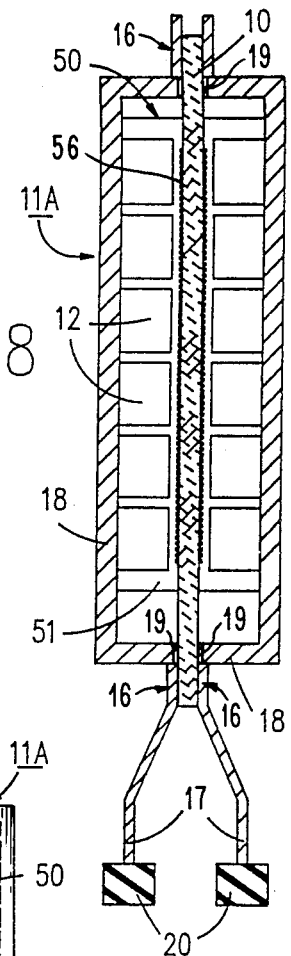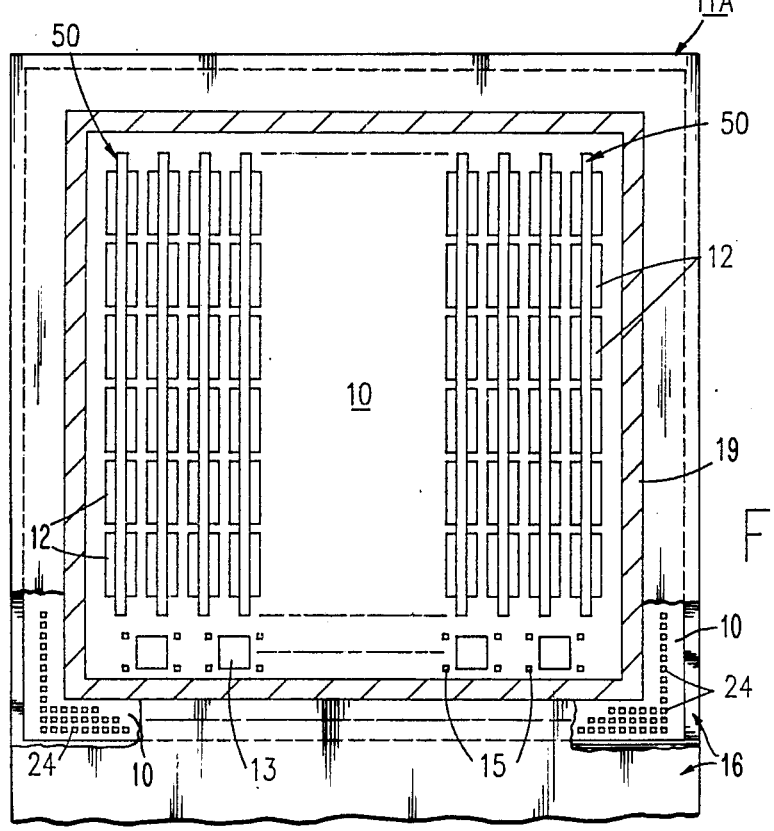

CERAMIC CARD ASSEMBLY HAVING ENHANCED POWER DISTRIBUTION AND COOLING

As VLSI circuits become more dense, there is a need in the art to have semiconductor packaging structures that can take full advantage of the density and speed of state of the art VLSI devices. Present day modules made of ceramic, typically multilayered ceramic modules, are normally mounted onto cards or boards, which cards or boards combine together to form the Central Processing Unit (CPU) of a computer. The multilayered ceramic (MLC) modules typically have VLSI chips mounted on the top surface and typically have pins on the bottom surface thereof even though there are multilayer ceramic modules which have alternative mounting means such as solder bumps. The packaging scheme with modules on cards or boards substantially occupies two dimensions in space with VLSI chips, namely the X and Y Cartesian coordinates of the top surface of the MLC modules. The third dimension, the Z Cartesian coordinate, is not utilized. A packaging concept that would utilize this third dimension and therefore increase packaging density as well as machine speed is the edge connected ceramic card. The ceramic card with an edge connector provides the capability for denser packaging for primarily two reasons. First, the X, Y, and Z directions are occupied with VLSI devices, thus creating three dimensional packaging; and second because chips can be mounted directly to the ceramic card, eliminating a level of packaging (namely the MLC module). The ceramic cards are edge connected into the next level of packaging, typically a board. Ceramic cards for use in high density applications are described in an article entitled, "A Ceramic Card Concept" by Dorler et al, published April 1982 by the IEEE.

Using an edge connected ceramic card, chips may also be mounted on both sides of the card further increasing density. Thus double sided chip mounting, elimination of a level of packaging, and three dimensional packaging by taking advantage of the X and Y dimensions of the mother board plus the Z dimension between the mother board and adjacent structure have theoretically made ceramic cards a very positive alternative to standard two-dimensional multilayer ceramic packaging. Until the time of the present invention, ceramic cards have not been implemented in industry because of various fundamental problems, such as power distribution, cost, performance and cooling. Cooling is particularly a problem in high performance bipolar packages wherein VLSI devices dissipate high amounts of power. For example, present day VLSI bipolar chips have power requirements in excess of 20 watts per chip, and it is expected that these requirements will at least double within the next 10 years. This kind of power output requires water cooling. Two methods of water cooling are described in the IBM TDB entitled, "Low-Profile Ceramic-Card Cooling Package", October 1985, by Fedoush et al and "Three-Dimensional MLC Substrate Integrated Circuit Support Package", April 1978 also in the IBM TDB by Jarvela et al which are herby incorporated by reference.

A major reason for ceramic cards not being implemented in industry is the inherent power distribution problem which ultimately leads to a package with inadequate switching capability and subsequent performance reduction, thus making the package electrically unacceptable for use in modern day computer systems. As higher powered chips are used, and water cooling of the type described in the above publications is required, physical restraints on the power distribution system are created. The power distribution problems of the ceramic cards described in the literature are most easily understood by referring to FIGS. 1A-1D. The problems are basically related to the structure of the ceramic card 2 wherein there are a limited number of input/output (I/O) positions on the edge connectors and a limited number of I/O pads 3 on the ceramic card for bringing power to and from subsequent levels of packaging to the ceramic card. In addition, the high wiring density required by the ceramic card and metallization used therefor present power distribution problems. In FIGS. 1A and 1C the current path for a state of the art ceramic card is shown. The current path from the edge connector through I/O pads 3, through internal MLC wiring layers, to each of the chips 4 on the surface of the ceramic card requires high current densities because of the limited number of I/O pads 3 available for power and the current crowding due to not having power feed points in close proximity to the chips 4. Referring to FIGS. 1B and 1D, the metal power planes 8 in present ceramic card packages have a relatively high resistance, i.e. approximately 5.5 mil ohms per square for molybdenum or approximately 2 milli ohms per square for copper metal. This is due in part to processing limitations in manufacturing of present ceramic cards, wherein metallization of power planes is accomplished by applying metal paste by screening or other means that result in highly resistive conductors. When coupled with high current densities, this leads to DC voltage drops on the power planes 8 of the ceramic card package that are extremely high compared to state of the art packaging structures such as multilayer ceramic modules (i.e., TCMs as described in U.S. Pat. No. 3,993,123). The high current densities also result from current multiplying on the power planes as shown in FIG. 1B. As each chip 4 draws its current, the current drawn is added to whatever current is in series with it and the entry point I/O pad 3 of the ceramic card 2, which results in a high DC drop for devices on chips at the opposite end of the card of the connector. In addition to the high DC resistance of the power distribution system, the effective inductance of the ceramic card package is high. Inductance is also high due to the limited number of high inductance paths for bringing the power to the ceramic card from the edge connectors as well as the distance required to travel on the internal ceramic card power planes to the chips. Moreover, any decoupling capacitors placed near the chips to enhance simultaneous switching take a proportionately long time to react because the LC constant, i.e. time constant, is correspondingly high. The I/O pad locations on the edge of the ceramic card are placed where they are because the pin and surface mount technology used for packaging multilayered ceramic modules does not allow one to take advantage of the three-dimensions of packaging provided by ceramic cards, and the double sided mounting of chips is not possible without an edge connector system. This leads to current traveling long distances on the power planes, causing high resistance (i.e. DC drops) and inductance (adversely effecting simultaneous switching).

On the system level, ceramic cards have many potential applications that would provide denser circuit packaging, (i.e., see Dorler et al IEEE article), however ceramic cards would have their most common usage in memory applications. For example, referring to FIG. 2, in high end systems, a system mother board 30 30, (hereinafter referred to as board), typically has an area for logic or logic/memory combination modules 32 (i.e., thermal conduction modules as described in U.S. Pat. No. 3,993,123) and an area for organic cards 34. The memory cards may typically be edge connected cards (i.e., see U.S. Pat. No. 3,312,878) having a plurality of hermetically packaged memory chips (i.e. Dual in line Packages (DIPs)) and at least one logic support chip for addressing and moving data. FIG. 2 represents a typical board 30 in which the ceramic card assembly of the present invention may be incorporated. The board typically has integrated circuit chip modules 32 and circuit cards 34, which typically have organic dielectric layers incorporated therein. In most applications, the circuit cards 34 are used for packaging memory packages 36 which typically are comprised of single chip modules, most commonly DIP's. However, even in memory applications, a certain number of logic support modules 37 for addressing, data transfer, etc. are also required. These logic support modules 37 have relatively high power and high input/output signal and power requirements, and are thus packaged in relatively complex and expensive ceramic module packages which typically require thermal enhancements between the chip and ceramic cap of the ceramic modules if the logic chips are to use the majority of their circuits, which is required as circuit densities increase. For example, present day logic support chips dissipate greater than 20 watts of power when maximum circuitry is utilized, and this value is expected to approach 50 watts per chip as circuit densities increase. It would be advantageous from both a cost and reliability standpoint to be able to eliminate logic support modules 37 and package the logic support chips and any required internal thermal enhancement directly on a ceramic card. In order to accomplish this, integral power distribution means and thermal management means are required. If ceramic cards could replace these memory cards, then a level of packaging is eliminated (i.e. DIP's and logic support modules are no longer required since memory chips and logic support chips are mounted directly to the ceramic card, then hermetically sealed as a group). In addition, the system density and performance is increased because the circuits are packaged closer to each other on the ceramic card because intermediate packages are eliminated. Also, fewer logic support chips are required in a ceramic card package having enhanced power distribution and power dissipation capability because a greater number of circuits on the support chips can be utilized if power dissipation is available because of enhanced cooling, (note that present day memory cards are air cooled).

While system density and performance may be enhanced by utilizing a ceramic card package having enhanced power distribution and power dissipation capability, it is also important that the ceramic card package be compatible with present day high end systems so that systems can be extended to higher performance levels without major design changes. Thus, if a system mother board such as that shown in FIG. 2 is to enhance its memory with ceramic cards, it is desirable to be able to simply unplug the existing cards and plug in the ceramic card package assemblies. This extendibility is especially important in view of the fact that the system mother boards are very complex and expensive and any steps that can extend the use of this proven high performance technology rather than require a system level redesigning effort should be taken.

As integration levels increase, demands for inputs/outputs (I/O) at the chip and package level also increase. Thus, the ceramic card package should provide a greater number of I/O between the chips and ceramic card than is possible between chips and any state of the art cards that chips and associated packaging modules (i.e., DIPS, etc.) are attached to.

In sum, prior art attempts at using ceramic cards to take advantage of their inherent high density, three dimensional packaging density, (i.e., "A Ceramic Card Concept" by Dorler et al), have not been successfully used in industry because of power distribution and thermal management problems that the prior art did not overcome. In particular, simultaneous switching and corresponding performance was limited because of the relatively high resistive and inductive path between power sources, (i.e., power planes incorporated in the multilayered ceramic cards), and devices requiring the power. Primary contributors to the power distribution problem were the high current density and corresponding current crowing on power planes as well as current multiplying in the package due to the location of and limited number of power input/output connections to both the ceramic card itself, and directly to the devices. Another reason was the metallization (i.e., typically screened metal paste) used in standard multilayered ceramic cards.

Moreover a ceramic card package must be capable of simultaneously overcoming these power distribution problems while providing thermal management for high powered (i.e., 20–50 watts) logic chips, and having the ability to be compatible with subsequent levels of packaging that comprise the central processing unit of a computer system.

Thus, there is a need in the art for a ceramic card having a high density of chips on either one or both sides of the ceramic card substrate, having an effective power distribution system of low inductance and a low DC drop. This structure would thus allow for high simultaneous switching capability and for low noise levels in the package.

There is also a need for this system to have the capability of cooling more than 20 watts per chip. By having the low noise and high simultaneous switching as well as ample thermal management, it is possible to package high density, high powered, high I/O VLSI chips in a high density three-dimensional ceramic card package.

There is a further need to enhance the density and access to memory of a system without redesigning the basic system, and to extend present day VLSI systems to larger capacity and supercomputer applications.

SUMMARY OF THE INVENTION

The ceramic card package of the present invention can extend present day technology to meet increasing density and performance demands and can extend this technology into the realm of supercomputers. The limitations of the prior art have been overcome by the present invention which successfully provides densely packaged circuitry, taking advantage of three dimensions (i.e., X and Y Cartesian coordinates of the top surface of standard multilayered ceramic modules and the Z Cartesian coordinate extending from the surface of a mother board, vertically to the next structure). The present invention generally comprises a combination ceramic card/flexible power distribution package having enhanced thermal management capability incorporated therein. The combination overcomes the limitations of the prior art, and accomplishes the following objects. The combination is described further following the objects.

It is an object of the present invention to package high density, high powered, high I/O VLSI chips in a three-dimensional ceramic card package.

It is another object of the present invention to have a ceramic card package with a power distribution system having a low inductance and high simultaneous switching capability.

It is a further object of the invention for the power distribution structures to have a low resistance, i.e. low DC drop.

It is a further object of the current invention to reduce current multiplying on the power planes and to match the power entry points to the ceramic card to the chip locations.

Another object is to have chips mounted on both sides of the three-dimensional ceramic card.

Another object is to incorporate decoupling capacitors into the ceramic card package, and improve the performance capability of those capacitors.

It is yet another object to provide thermal management so that high powered VLSI chips may be incorporated into the package.

A further object is to increase the system level memory capability of high-end computer systems and reduce the number of logic support chips and modules required.

A further object is to extend present systems into the supercomputer realm.

These objects and other objects will become evident from the description of the preferred embodiments which are described briefly as follows:

As best shown in FIG. 4, a flexible power distribution structure is incorporated into the ceramic card package. The combination ceramic card/flexible power distribution package eliminates the above stated deficiencies in the ceramic card packaging structures, making ceramic cards viable alternatives for high density, high powered VLSI packaging. Each flexible power distribution structure 16 is comprised of a flexible material 30, typically polyimide, having metal power planes, i.e. 25, 26, 27, incorporated therein. These copper planes are typically in the order of 1 to 3 ounces of copper (i.e. the thickness per ounce of a layer of copper is approximately 1.4 mils), but not limited thereto, and are much lower in resistance than MLC type power planes used in state of the art ceramic cards. Typically the difference in resistance is an order of magnitude because the screened metal used in MLC technology cannot be made as thick or dense as the 1 to 3 ounce copper planes preferably used in the present invention. This order of magnitude reduction of DC resistance allows for better current spreading on the power planes of the improved ceramic card package, and also drastically reduces the current crowding problem. There are a large number of conductive connections 25A, 26A, 27A incorporated into the flexible power distribution structures. The conductive connections may be in many forms such as appendages extending from the power planes 25, 26, 27 to the outside surface of the flexible power distribution structures, or as solder balls (see FIG. 6) that are attached to plated through holes in the flexible power distribution structures. The purpose of these connections is to bring power directly to pads 24 that are spread over the flexible power distribution structure ceramic card interface, thus providing localized power sources for each of the chips 12. The application of a flexible power distribution structure to the ceramic card provides multiple entry points of power to the ceramic card surface rather than from the edge, reducing the current multiplying and thus a major portion of the effective resistance and inductance of the ceramic card package. The lower current due to the decrease in current multiplying and the low inductance leads to a much higher simultaneous switching capability than in present day ceramic card packages. In addition, when decoupling capacitors are used, they will be more effective in the present ceramic card package because the time constant is reduced. The flexible power distribution structures 16 are preferably incorporated into an edge connector 20 as shown in FIG. 5B, but may be compatible with many types of connections due to its flexibility. The application of the flexible power distribution structures 16 allows power to be delivered to both sides of ceramic card 10, thus making the mounting of chips on both sides of the card possible with the enhanced power distribution as described above, as well as providing many connection options between first and second level packages. The flexible power distribution structures also facilitate the cooling that is required by allowing cold plates to be close to the heat loads, preferably in contact with the caps. In sum, multilayered ceramic ceramic card proposals in the past, i.e. see FIG. 1, suffer from inherent power distribution problems and cooling problems, that have made such proposals very restricted in their application. The present invention combines ceramic card packages with an integral flexible power distribution structure to enhance power distribution to the point where ceramic cards are a viable packaging alternative. Moreover, thermal management is provided to extend this technology. Using the present invention, the current density on the power planes embedded in the ceramic cards 10 is reduced by at least a factor of 2.5. This is primarily because the high conductivity and low inductance of the flexible power distribution structures surrounding the power loads (i.e., chips 12) on the ceramic card allow current to flow into the chips from a multitude of directions. The bulk of the current to each chip is supplied by power contacts in close proximity to the corresponding power loads (i.e. chips). If any high current densities exist at all, it is in the flexible power distribution structures which can handle such high densities without detrimental electrical effects. Moreover, the distance travelled from any power plane to power consuming devices is typically reduced by at least a factor of 2. Thus, the present combination ceramic card flexible power distribution structure package provides a power distribution system having low noise and low packaging inductance that can adequately support the high speed and high power devices of the state of the art while providing the high density associated with the ceramic card concept which takes advantage of the X, Y and Z dimensions in space for packaging. The ceramic card also eliminates a level of packaging, and its mechanical properties allow for an assembly that can be cooled and easily assembled or repaired. In the present day of increasing packaging density and increasing VLSI chip speed, size and power, the use of ceramic cards having the power distribution and cooling capability described herein that can enhance the overall performance of such chips and corresponding performance of VLSI systems is a positive advance in the art.

BRIEF DESCRIPTION OF THE DRAWINGS

The above and other objects and features of the invention will become apparent from the following description taken in conjunction with the accompanying drawings, wherein:

FIGS. 1A-1D schematically depict the power distribution problems associated with state of the art ceramic card packages.

FIG. 3A is a magnifies detail of the solder ball connections between each flexible power distribution means and ceramic card.

FIG. 3B is a magnified detail of alternative connections between each flexible power distribution means and ceramic card.

FIGS. 5A-5D are the plan view, elevational view, broken away elevational view detail, and broken away plan view detail, respectively, of a double sided chip mounted ceramic card assembly.

FIG. 7 is a front elevational view showing the connection of ceramic in-line packages to a ceramic card.

FIG. 8 is a front elevational view of a ceramic card assembly having ceramic in-line packages incorporated therein.

FIG. 9 is a plan view of an uncapped ceramic card assembly having ceramic in-line packages incorporated therein.

FIG. 10A is a magnified three dimensional detail of the solder ball connections between each flexible power distribution means and ceramic card.

FIG. 10B is a magnified detail of alternative connections between each flexible power distribution means and ceramic card.

DESCRIPTION OF THE PREFERRED EMBODIMENTS

Figure 2:
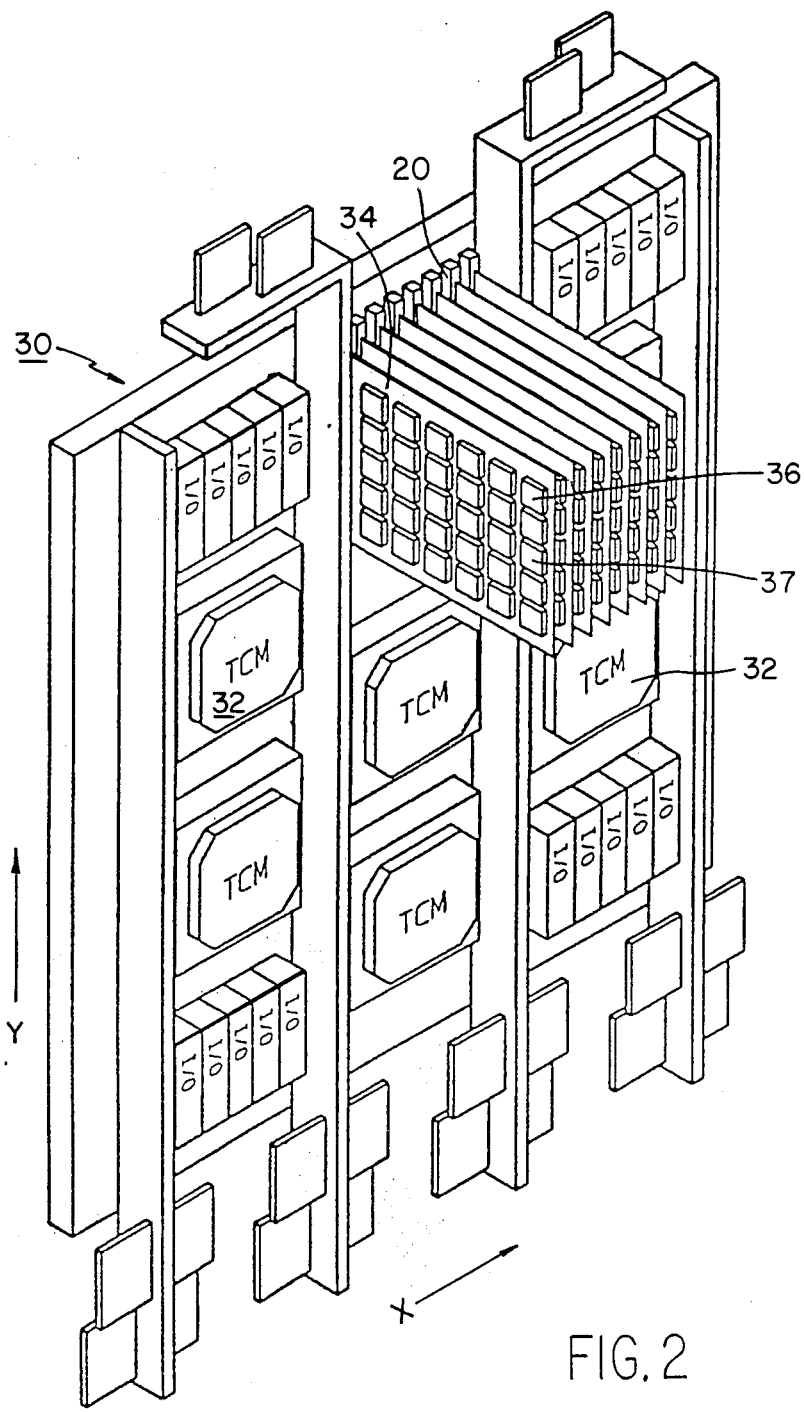
FIG. 2 depicts a card on board central processor containing plug in modules and edge connected cards.
Figure 3:
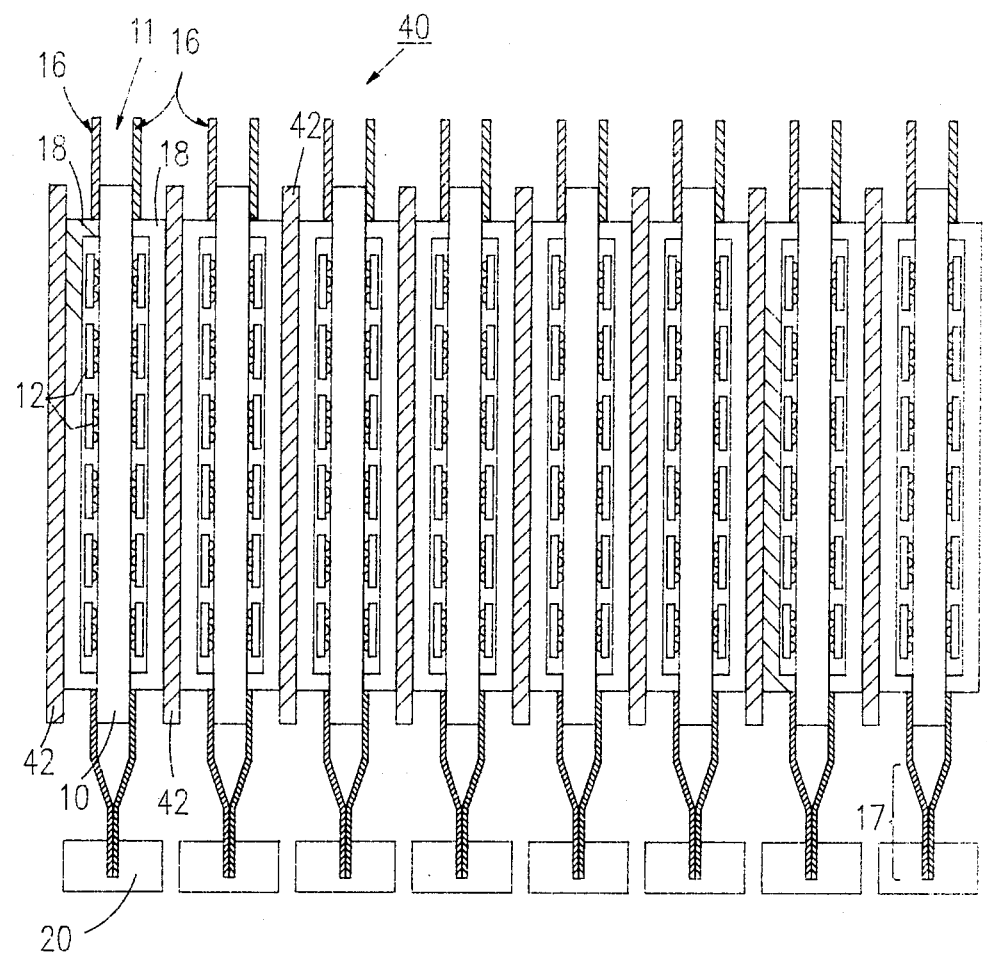
FIG. 3 is a front elevational view of a field replaceable unit of 8 ceramic card assemblies of the present invention wherein the first of the eight ceramic card assemblies is shown in cross section, and the remaining ceramic card assemblies are shown in full front elevation.

FIG. 3 represents a typical FRU 40 (i.e., field replaceable unit) of 8 ceramic card assemblies 11 of the present invention. Each ceramic card assembly 11 of FRU 40 comprises a ceramic card 10 and associated flexible power distribution structure(s) 16 that are adapted to match the geometry of the ceramic card and connection to the next level of packaging. The combination of flexible power distribution structures 16 and ceramic card 10 forms a ceramic card assembly 11, and a plurality of card assemblies 11 and cold plates 42 forms a FRU. The FRU may replace the organic cards 34 shown in FIG. 2, however it is evident that the ceramic card assembly 11 of the present invention may be used in many system applications and board configurations. Starting from the left, FRU 40 generally comprises a cold plate 42, a first flexible power distribution structure 16 (to be described in greater detail hereinafter), a cap 18 which preferably contacts cold plate 42 so that heat generated by devices on the ceramic card can be conducted to the cold plate, ceramic card 10 having chips directly attached thereto, an optional second cap 18 and second flexible power distribution structure 16 (used if double sided chip joining is used). The structure then repeats starting with another cold plate 42. The edge connectors 20 shown in FIG. 3 represent one of many means that may be used to connect a ceramic card assembly 11 of portion thereof to the next level of packaging. The application of the flexible power distribution structure allows for a variety of connections to the next level of packaging while providing enhanced power distribution to the devices on chips mounted on ceramic card 10. For example, in FIG. 3 flexible power distribution structures 16 provide power to the ceramic card 10 in a manner to overcome the power distribution problems of the prior art (details to follow) while the portions 17 of the flexible power distribution structures that interface with the next level of packaging (i.e., board) are bent and fit into edge connectors 20. The flexibility is required to form this bend or other required type bends as will be described in the working examples to follow.

FIG. 3A shows a magnified detail of the solder ball connections between each flexible power distribution means and ceramic card.

FIG. 3B shows a magnified detail of alternative connections between each flexible power distribution means and ceramic card, wherein wire bonds exist between pads 24 and flexible power distribution means 16. The solder ball connections are shown in three dimensions in FIG. 10A, while wire bond connections are shown in FIG. 10B.

Figure 4:
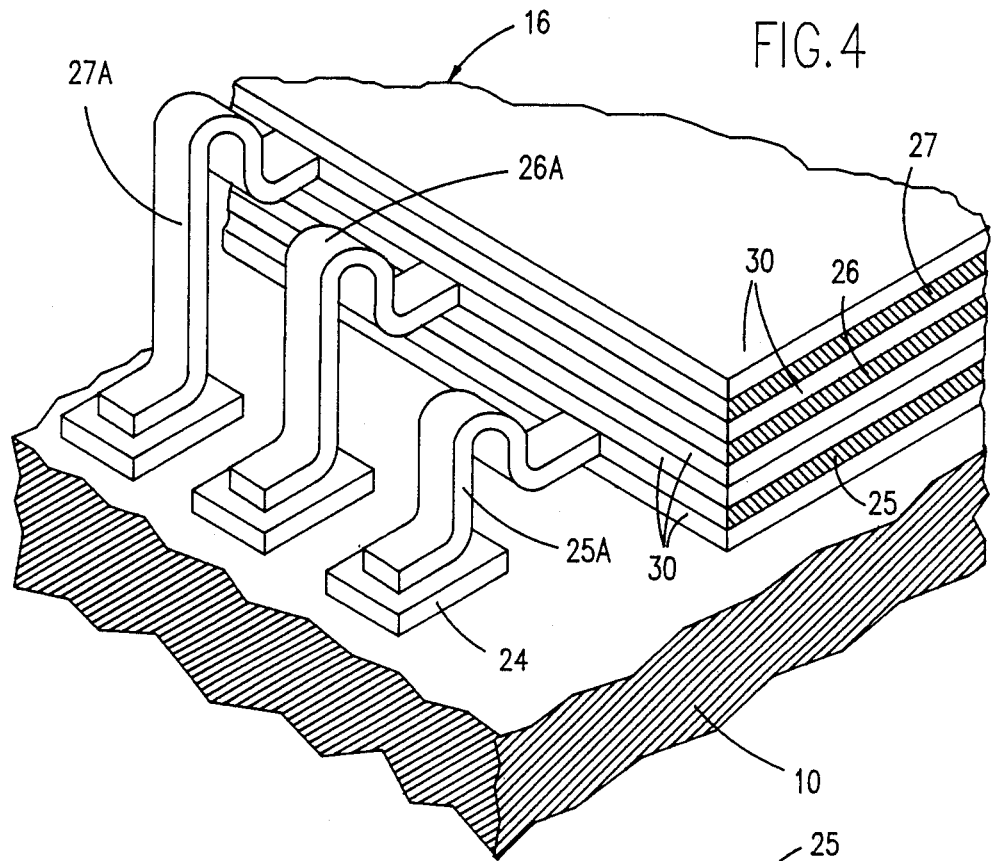
FIG. 4 is a etail showing the combination of a portion of the ceramic card and a flexible power distribution structure.

FIG. 4 represents a portion of one of the preferred embodiments of a single ceramic card assembly 11 of the present invention. The flexible power distribution structure 16 is comprised of layers of a flexible dielectric material 30 having a low dielectric constant, polyimide being preferred. Between the layers of flexible dielectric material are conductor layers, i.e. 25, 26, 27. These conductor layers provide the required power for the semiconductor devices of chips mounted on the ceramic cards 10. In the present embodiment, three power levels are provided for bipolar devices mounted on the ceramic cards. Conductive layers 25, 26, 27 may be solid metal, preferably one to three ounce copper. This provides a much lower DC drop across power planes than screened metal of any kind can provide in a standard multilayered ceramic (MLC) package. The difference in DC resistance is typically an order of magnitude because the screened metal used in MLC substrates is not as thick or dense or conductive as the metal of the flexible power distribution structure, and thus has a higher resistance. This improvement in the power planes that are combined with the ceramic card creates improved current spreading on the power planes of the ceramic card package and also reduces current crowding problems that are inherent in prior art ceramic card proposals. In memory applications, the devices requiring the three levels of power provided by flexible power distribution structures 16 typically are logic support chips which provide the required data transfers addressing, etc. Input/output pads 24 are incorporated on the surfaces of ceramic card 10 to provide localized sources of power for semiconductor devices on chips 12. Thus, the pads 24 provide multiple entry points for power that are located close to the devices that require the power rather than at one edge of the ceramic card. The aforementioned power distribution problems are alleviated partly because the multiple power entry points reduce current multiplying and effective inductance. The power distribution is further enhanced because the metal used on layers 25, 26, 27 provides for a relatively low DC drop and low inductance as described above. There is low electrical loss in power distribution because of the reduced DC drop and inductance in the path from power planes 25, 26, 27 to pads 24 to the powered devices on chips 12. The connection between pads 24 and power planes 25, 26, 27 may be made by low inductance connecting means. In FIG. 4 appendages 25A, 26A, 27A from power planes 25, 26, 27 respectively form this connection. In applications where the thermal coefficient of expansion between the flexible power distribution structure 16 and ceramic substrate are high, and there is a large temperature difference between the ceramic and flexible power distribution structure, these appendages 25A, 26A, 27A are preferably U shaped to minimize the stress applied to the solder joint between pads 24 and appendages 25A, 26A, 27A because of the thermal coefficient of expansion mismatch between materials and high temperature difference. Other preferred connection means can be used for various applications wherein lowering inductance is more important than matching thermal expansion coefficients.

The electrical advantages that this package provides leads to much higher simultaneous switching capability than in present day ceramic cards for the same chip technology, (i.e., it permits switching of several circuits, typically oft-chip drivers, at the same time. For example, if the switching current demand for each driver on the package is 10 mA, and the demand is for 10 drivers to switch simultaneously, the switching current will be 200 mA.) Switching capability can be further increased if decoupling capacitors are incorporated into the flexible power distribution structure, causing the effective inductance of the package to be further reduced because a part of the switching current is supplied by the capacitors.

Another advantage of using the flexible power distribution structure 16 in the ceramic card assembly is that it allows us to bring solid copper planes 25, 26, 27 close to devices requiring the power while being flexible enough to bring power to both sides of the ceramic cards. The ends 17 of the flexible power distribution structures 16 are capable of either meeting at connector 20 as shown in FIG. 3 or leading to another connection scheme for various types of packaging strategies to be explained in detail hereinafter.

By varying the thickness of polyimide layers 30 and metal layers 25, 26, 27, or by adding a stiffener, (i.e., typically a composite of an arimid fiber and polyimide matrix or copper/invar/copper) the thermal coefficient of expansion (TCE) of the flexible power distribution structure 16 can be made to substantially match the TCE of the ceramic material used to manufacture the ceramic card 10. Thus, a large temperature difference will not cause high thermal stresses. This allows appendages 25A, 26A, 27A to be a different shape or may allow for their elimination altogether.

Referring back to FIG. 3, the FRU 40 has numerous cold plates 42 which are required for many applications. A low thermal resistance path between cold plates 42 and caps 18 is required for heat to be transferred from chips 12 to the cold plates 42. Various means exist for accomplishing this such as keeping the ceramic caps and cold plates biased toward each other so that intimate contact exists, or by having a resilient material of high thermal conductivity between the caps and cold plates. The cold plates may be cooled by many means, including cooled air, water or refrigerants.

The FRU 40 made of a plurality of ceramic card assemblies 11 solves both the power distribution and cooling problems that have made prior ceramic card proposals unacceptable for use in high performance VLSI systems in the past. The combination of the ceramic card and integral flexible power distribution structure enhances power distribution to a point where current density on the power planes 25, 26, 27 is reduced by a factor of at least 2.5; while because of the location of pads 24, the distance travelled from a power plane embedded in the ceramic cards to power consuming devices on the ceramic cards is reduced by at least a factor of 2. The invention provides low noise, low inductance and high simultaneous switching capability that can support high speed devices required in current and future VLSI systems, while also providing unprecedented density as will be described in the working examples that follow. Thus, this three-dimensional FRU 40 provides high density, along with high performance power distribution and thermal management in a single package. This also allows us to reduce packaging complexity and cost because the memory packages 36 mounted on organic cards 38 by soldering means, etc. in present state of the art systems as shown in FIG. 2 are not required since a plurality of chips are directly attached to ceramic cards and hermetically sealed in the present invention. The majority of modules 36 are DIP's, but some are logic support modules 37 which are relatively expensive. The elimination of these logic modules provides a major cost and reliability savings on the system level. Moreover, the number of logic chips may be reduced because each chip can utilize more circuits than in the past because the present package is capable of cooling the high heat loads that result from high circuit utilization. Until the present invention, it was not realistically possible to take advantage of the high density, reliability and cost savings possible with the ceramic card because of the inherent power distribution and thermal management problems of prior ceramic card packages. Solutions to such problems become more important as chip packaging densities and simultaneous switching requirements increase, which increases thermal management and power distribution requirements respectively.

Figure 6:
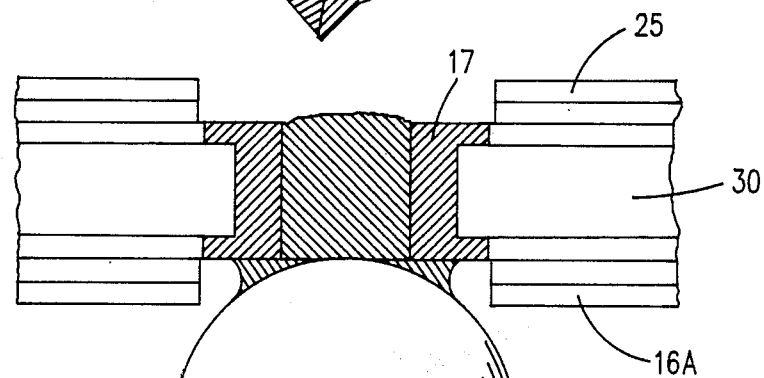
FIG. 6 is a front elevational view of a preferred connection between power contacts on the ceramic card and conductive power planes in the flexible power distribution structure.
Figure 6:
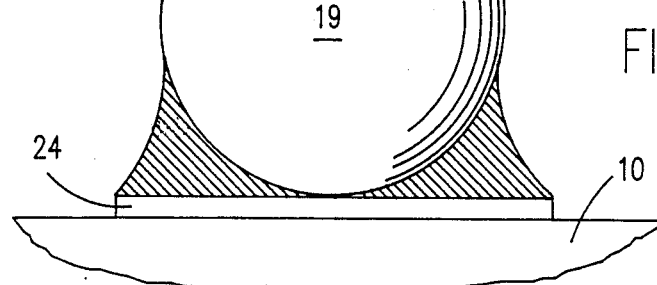

The ceramic card assembly of the present invention is adaptable to many systems because numerous cooling options and connection options to the next level of packaging are possible using this invention. As stated above, connections between the flexible power distribution means 16 and pads 24 on the ceramic card can be made by different means, depending on the application. For example, if the difference in the TCE between the flexible power distribution system and the ceramic card substrate is large, then the connections shown in FIG. 4, i.e., appendages 25A, 26B, 27C may be used. If the difference in TCE and temperature difference between the opposite facing sides of the ceramic card and flexible power distribution structure are relatively small or if means to compensate for the TCE difference such as stiffeners are used, then electrically efficient, low inductance connections such as solder balls 29, see FIG. 6, are attached between pads 24 and plated through holes in the flexible power distribution means. The following working examples may be used for various applications. The preferred application of the ceramic cards and flexible power distribution structure will be described in each example.

EXAMPLE I

Figure 5A:
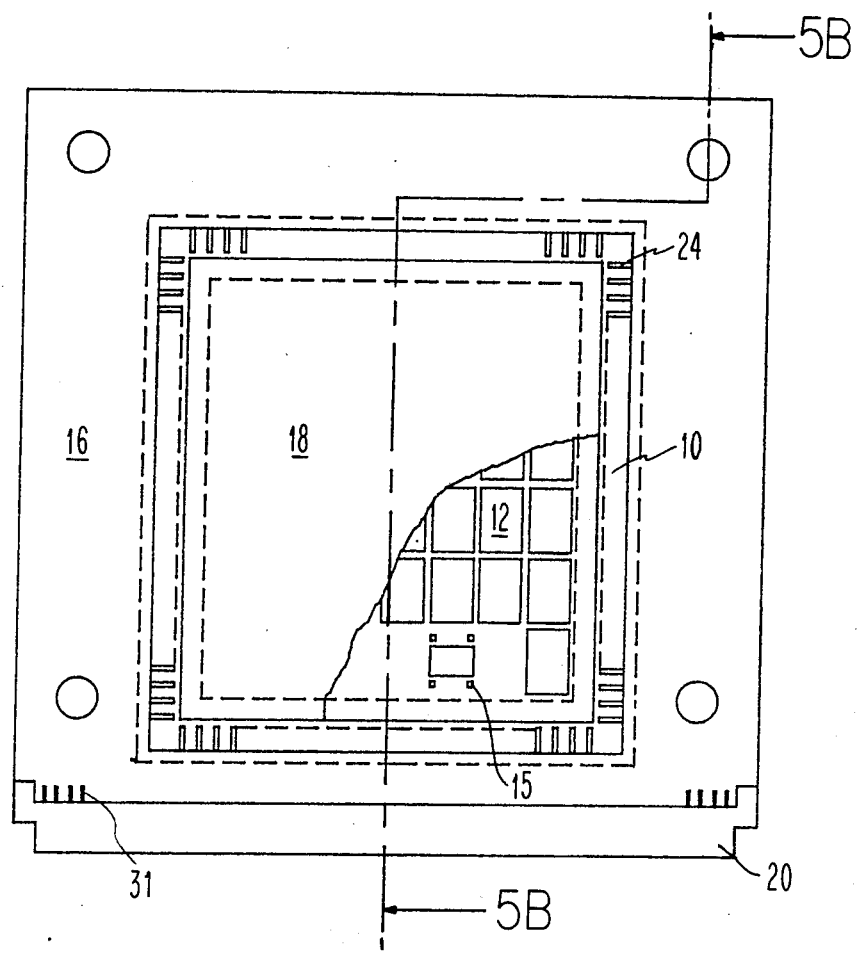

Double Sided Mounting of Chips-FIGS. 4,5

Example I is the example shown partially in FIG. 4. FIGS. 5A-5D show further detail of this ceramic card 10 having chips 12 mounted on both sides thereof. To facilitate the mounting of chips on both sides, pads 24 are mounted on both sides of the ceramic card around the periphery of the chips. Appendages 25A, 26A, 27A contact pads 24, forming connections to power planes 25, 26, 27 while allowing for the double sided mounting of chips. The ceramic card assemblies 11 are assembled into a FRU 40 as shown in FIG. 3, and replace the organic cards 34 of board 30 shown in FIG. 2. For incorporation into the board shown in FIG. 2, the dimensions of ceramic card 10 preferably are 127.5 mm wide by 127.5 mm long. The thickness of the ceramic cards varies with the number of layers used. In this example there are seventy-two 4 Megabit memory chips and three logic support chips on each side of ceramic card 10. Each flexible power distribution structure 16 preferably has 268 appendages 25A 26A, 27A to contact the input/output pads 24 on each side of the ceramic card 10. Each polyimide layer 30 of the present flexible power distribution structure is approximately 1 to 3 mils thick, while each copper layer 25, 26, 27 is approximately 1.4 to 4.2 mils thick. To facilitate the double sided mounting of chips, the flexible power distribution structures are provided with a cut out portion or portions for the caps 18 of the ceramic cards 10 to fit through, providing a "window" wherein the chips 12 and cap 18 reside. Outside of the "window" are pads 24 on the ceramic card and corresponding contacts, i.e., 25A, 26A, 27A on the flexible power distribution structures 16.

After chips 12 are mounted on the ceramic card 10, they are hermetically sealed by caps 18 which are preferably ceramic. Preferably, connections from connection means such as approximately 50 mil diameter solder balls attached to plated through holes in the particular configuration of modified flexible power distribution structures 16A, to pads 24, as shown in FIG. 6, are then formed, and the two ends of the flexible power distribution structures are joined at connector 20 to connect to the next level of packaging. Decoupling capacitors 15 (see FIG. 5A) may be incorporated to further enhance simultaneous switching capability if necessary.

With the chips and card sizes specified above, each ceramic card 10 provides 64 Megabytes of memory and the associated support logic. To properly address memory chips and transfer data, six logic support chips are required (note that this is opposed to eleven similar logic modules that are required on an organic card because those modules cannot utilize all of their circuitry primarily because of cooling limitations. Using the ceramic card assemblies of the present invention, the logic support modules 37 required for standard packaging, i.e., organic cards as shown in FIG. 2, are eliminated as well as DIPs 36. Besides eliminating modules and increasing density, electrical performance is enhanced because the pins of modules 36, 37 are no longer required, thus the inductive and resistive drops associated with the pins are eliminated and the exchange of electrical signals between the memory and logic chips is carried out by shorter, direct paths, without going through interpackage discontinuities which typically add significantly to delay. Decoupling capacitors may be incorporated into the ceramic card in those applications where simultaneous switching capability must be further enhanced. The overall electrical performance of the ceramic card assembly of this example is enhanced since current density on the embedded power planes of the ceramic cards is reduced bringing down noise levels and inductance therefore improving simultaneous switching capability.

Note that in alternate versions, flexible power straps may be interspersed between the chips instead of around a window frame so that the power is brought close to the chips as required.

EXAMPLE II

(Single Sided Mounting Of Chips)

This example has chips mounted on only one side of ceramic card 10, and the flexible power distribution structure is mounted on the complete back side of ceramic card 10. The dimensions of ceramic card 10 and the flexible power distribution structure 16 are approximately the same as in Example I. Using the same chips as in Example I, each ceramic card provides 32 Megabytes of memory. This embodiment would be used when it is critical to bring power from the flexible power distribution structure directly to tabs on the ceramic card that are located in close proximity to the chip power I/O that require the specific power. The density of the ceramic card assembly of this example is approximately one-half of that of Example I, however power distribution may be enhanced because power may be brought directly from the flexible power distribution structure into very close proximity of the power loads.

EXAMPLE III

Ceramic Cards Having Ceramic In-Line Packages

This embodiment is best shown in FIGS. 7-9. It is known in the art to utilize SIPS (serial or single in line packages which are subassemblies with modules or chips attached thereto, the subassemblies are in turn attached to cards) mounted on cards to increase packaging density. Modules or chips are typically soldered to the SIPS and the SIPS are typically soldered to the cards, i.e., see U. S. Pat. No. 4,656,605. In the present example, direct chip attach technology is used to attach chips to ceramic subassemblies, and the ceramic subassemblies are then mounted to ceramic cards, further increasing density. The combination of a ceramic subassembly having edge connection tabs 56 (see FIG. 8) for connection to the ceramic cards and directly attached chips is herein termed as a Ceramic In Line Package.

Ceramic in line packages (CIP's) 50 are attached to ceramic cards 10 as shown in FIGS. 7 and 8. The CIP's have chips 12 directly attached to ceramic strips 51 and CIP input/output tabs 56 attach each CIP at the ceramic card 10/CIP 50 interface. This embodiment demonstrates how the concepts of the present invention dramatically increase the density of packaging in a system. As in examples I and II, the flexibility provided by flexible power distribution structure 16 allows for compatibility with the next level of packaging. The density of each ceramic card assembly is at least quadrupled per card in this embodiment over Example I by incorporating ceramic in-line packages (i.e. CIPS) into the ceramic card assembly. However, on a system level, i.e. FRU, etc, the density is approximately one half of that on a card level because of the space occupied by the FRU of this embodiment. Each ceramic card 10 incorporates a plurality of CIPS to increase packaging density. As shown in FIGS. 7 and 8, CIP's are bonded to the ceramic card 10, preferably by solder balls 56. Each CIP has chips 12 directly mounted thereto, preferably by solder balls 54. To enhance the cooling of chips 12, an internal thermal enhancement 57, such as thermal grease, may be applied between the ends of the chips and the ceramic cap. The ceramic caps are placed in contact with cold plates to complete the thermal path from chips to cold plate. Using the same flexible power distribution structure as in Example I to facilitate double sided mounting of CIP's, and the same memory and logic support chips, the memory density of each ceramic card assembly is quadrupled. Using CIP's having 12 chips per CIP, there are 288 4 Megabyte memory chips and 6 logic support chips on each side of ceramic card 10.

After chips 12 are mounted on CIP's 50, they are attached to ceramic card 10, and hermetically sealed as shown in FIG. 8. Ceramic card assemblies 11A require more lateral space than ceramic card assemblies 11 of Examples I and II because CIP's 50 extend the lateral dimensions further than standard chips. The flexibility of the flexible power distribution structures 16 is critical to incorporating ceramic card assemblies 11A into an existing computer system. For example, four ceramic card assemblies 11A, each being configured as described herein and s own in FIG. 8 can be placed into the area of board 30 occupied by the 8 organic cards 34 shown in FIG. 2. Each flexible power distribution structure 16 is flexed into an edge connector 20 on the board 30. The flexibility allows this design to be incorporated into boards of other configurations also.

FIG. 9 shows a plan view of the ceramic card assembly 11A of this example with the caps removed and seal band 19 thus being exposed. There are 6 logic support chips 13, 24 capacitors 15, 24 CIP's 50 and 288 memory chips 12 per side. Power tabs 24 are around the perimeter of the area that is to be hermetically sealed. Each ceramic card 10 provides 256 Megabytes of memory, and requires 12 logic support chips. Note that 44 logic support modules are required for an equivalent number of memory chips in the state of the art organic card approach shown in FIG. 2. Thus, in addition to eliminating the need for individual memory modules and logic support modules, the number of logic support chips that are required is reduced. This is because the memory chips are densely packed and partly because the logic support chips 13 can utilize a greater number of circuits than in present day systems. Logic support chips presently cannot fully utilize their circuits because the resultant chip power would be too high, and the chip junction temperature would be exceeded causing system failure. Since this ceramic card assembly has ample cooling capability, the logic support chips may be used more efficiently. Four of the ceramic card assemblies 11A shown in FIG. 9 and described herein provide 1 Gigabyte of memory. This is four times that which is possible with the present organic card approach in the same system confines.

EXAMPLE IV

Supercomputer

Supercomputers for the most part require lower chip junction temperatures (Tj) than state of the art system architecture due to high performance (MIPs, fast cycle times, etc.) requirements. CIP's can be utilized to form a supercomputer. The CIP's 50 are attached to ceramic cards 10 in the same manner as shown in FIGS. 7-9, and flexible power distribution structures bring power to tabs on the ceramic card surface in the same manner as any of the previous examples. The flexibility allows one to simultaneously connect each ceramic card assembly to the next level of packaging in the system, while uncapped ceramic cards containing chips 12 and CIP's 50 are placed into a carrier which contains a refrigerant, liquid nitrogen, or other low temperature fluid required for super computer applications. To provide high density memory in a supercomputer CPU, ceramic card assemblies as shown in FIG. 8 may be used. In particular, to supply 2 Gigabytes of memory, each assembly 11A incorporates 8 CIP's having 18 by 4 Megabyte memory chips per CIP mounted on each side of a ceramic card 10, providing a total of 144 by 4 Megabit memory chips and 32 logic support chips. The required junction temperatures of these memory chips is substantially lower than the junction temperatures required for similar chips in conventional systems, i.e., at least approximately 30°-60° C. lower. To achieve this, the ceramic card assemblies are placed into a refrigerant or liquid nitrogen. For example, the typical operating junction temperatures of the 4 Megabit chips used in Example I is between approximately 80° C. and 100° C. The preferred operating junction for the same chips in a supercomputer application is between approximately 30° C. and 40° C. The present invention provides the flexibility and density to facilitate such low temperature supercomputer applications.

The working examples using the aspects of the present invention provide denser electrically superior, more reliable packages, particularly for memory applications. All examples have been designed with present day semiconductor technology and the performance specified corresponds to the particular chip technology used. As semiconductor circuit density and complexity and chip powers increase, which is the industry trend, the integral thermal management, efficient power distribution, and flexibility of the present invention for high density, three dimensional packages will be of even greater importance.

Although the present invention has been fully described with reference to several preferred embodiments, many modifications and variations thereof will now be apparent to those skilled in the art, and the scope of the present invention is therefore to be limited not by the details of the preferred embodiments described above, but only by the terms of the appended claims.

We claim:
1. A three-dimensional multilayered ceramic card packaging structure comprising:
at least one multilayered ceramic card extending from a mother board;
said at least one multilayered ceramic card having a plurality of area array chip sites with solder balls mounted directly thereon and power contacts mounted directly on said ceramic card, a plurality of chips mounted directly on said solder balls;

at least one integral flexible power distribution structure connected to and providing low electrical loss power distribution to said power contacts of said ceramic card;

said at least one flexible power distribution structure comprising a composite of alternating insulation and solid metal power planes extending substantially adjacent to at least one of the surface areas of said multi-layered ceramic card having said power contacts thereon, wherein portions of said solid metal power planes are selectively connected to corresponding power contacts on the surface of said ceramic card while flexible ends of said at least one flexible power distribution structure are suitably connected to means for connecting to a subsequent level of packaging.

2. The packaging structure of claim 1 wherein there are a plurality of power contacts on each outer surface of said ceramic card.

3. The packaging structure of claim 2 wherein there are two of said composites of alternating insulation and conductive layers for said ceramic card, wherein portions of said conductive layers of one composite are selectively exposed to corresponding power contacts on one side of said ceramic card, and wherein portions of said conductive layers of the second composite are selectively exposed to corresponding power contacts on the other side of other side of said ceramic card.

4. The packaging structure of claim 2 wherein said two of said composites of alternating insulation and conductive layers are joined together at said means for connecting said conductive tabs to a subsequent level of packaging.

5. The packaging structure of claim 1 wherein said power contacts on said ceramic card at least surround the area occupied by said chip sites on said ceramic card.

6. The packaging structure of claim 5 wherein at least one aperture exists in said composite of alternating insulation and conductive layers so that at least the areas of said ceramic card having chip sites thereon are positioned within the boundaries of said aperture.

7. The packaging structure of claim 1 wherein portions of each of said conductive layers are selectively exposed to corresponding power contacts on said ceramic card by appendages which extend from said conductive layers.

8. The packaging structure of claim 1 wherein portions of each of said conductive layers are selectively exposed to corresponding power contacts on said ceramic card by solder balls which extend from said power contacts to said conductive layers via plated through holes.

9. The packaging structure of claim 7 wherein said appendages are U shaped.

10. The packaging structure of claim 1 wherein at least a plurality of said chip sites on said ceramic card are covered by a cap.

11. The packaging structure of claim 10 wherein a resilient material of high thermal conductivity is placed between said cold plate and said cap.

12. The packaging structure of claim 10 wherein there are a plurality of ceramic cards having said power distribution structures incorporated therein and said caps thereon, and a plurality of cold plates interspersed between every two oppositely facing caps, forming a field replaceable unit.

13. The packaging structure of claim 1 further comprising edge connected ceramic in-line packages connected thereto.

* * * * *

UNITED STATES PATENT AND TRADEMARK OFFICE
CERTIFICATE OF CORRECTION

PATENT NO. : 4,771,366
DATED : September 13, 1988
INVENTOR(S) : Bruce E. Blake et al It is certified that error appears in the above-identified patent and that said Letters Patent is hereby corrected as shown below:

At Column 3, line 3, after "board" delete the first occurrence of "30",

At Column 4, line 24, change "crowing" to --crowding--,

At Column 7, line 20, change "magnifies" to --magnified--, and

At Column 7, line 26, change "etail" to --detail--.

Signed and Sealed this

Eighteenth Day of July, 1989

*Attest:*

DONALD J. QUIGG

*Attesting Officer*  Commissioner of Patents and Trademarks